United States Patent [19]

Creuzet et al.

[11] Patent Number: 5,106,823
[45] Date of Patent: Apr. 21, 1992

[54] JOSEPHSON JUNCTIONS MADE WITH THIN SUPERCONDUCTIVE LAYERS

[75] Inventors: Gérard Creuzet, Paris; Jean-Pierre Hirtz, L'Haye les Roses, both of France

[73] Assignee: Thomson-CSF, Paris, France

[21] Appl. No.: 711,391

[22] Filed: Jun. 6, 1991

Related U.S. Application Data

[63] Continuation of Ser. No. 305,020, Feb. 2, 1989, abandoned.

[30] Foreign Application Priority Data

Feb. 2, 1988 [FR] France .................................. 88 01163

[51] Int. Cl.$^5$ ...................... H01B 12/00; H01L 39/12; H01L 27/12
[52] U.S. Cl. .......................................... 505/1; 357/4; 357/5; 357/65; 307/306
[58] Field of Search ................. 357/5, 65, 4; 307/306; 505/1

[56] References Cited

U.S. PATENT DOCUMENTS

| | | | |
|---|---|---|---|
| 4,869,598 | 9/1989 | McDonald | 307/306 |
| 4,905,319 | 2/1990 | Schroder et al. | 357/65 |

OTHER PUBLICATIONS

Koch et al., "Thin Films and SQUIDS Made from YBa$_2$Cu$_3$O$_y$", MRS Conf. (Apr. 1987), pp. 81–84.
Arrington et al., "Superconducting Weak Links formed by Ion Implantation", Appl. Phys. Lett., vol. 26, No. 4, Feb. 15, 1975, pp. 204–206.
Wada et al., "Substitution Effect of Sr for Ba of High T$_c$ S/C YBa$_2$Cu$_3$O$_{7-y}$ Ceramics", Jap. J. Appl. Phys., vol. 26, No. 5, May 1987, pp. L706–L708.
Maekawa et al., "Effects of Magnetic and Non-Magnetic Impurities on Anisotropic Singlet Superconductors", Jap. J. Appl. Phys., vol. 26 (5), May 1987, pp. L771–L773.
Hikita et al., "Oxygen Deficit Perovskite Structure with S/C T$_c$ Above 50K in La-Ba-Cu-O Compound System", Jap. J. Appl. Phys., vol. 26 (5), May 1987, pp. L615–L616.
Matisoo, J., "Josephson-Type S/C Tunnel Junct. S Applications", IEEE Trans. on Mag., vol. Mag-5, No. 4 (Dec. 1969), pp. 848, 851, 871, 872.
Clark et al., "Feasibility of Hybrid Josephson FET", J. Appl. Phys., vol. 51, No. 5 (May 1980), pp. 2736–2743.
Tsai et al., "All-Ceramics Josephson Junctions Operative up to 90° K.", J. Appl. Phys., vol. 6, No. 5 (May 1987), pp. L701–L703.
Ohshima et al., "S/C and Structural Properties of the New Ba$_{1-x}$Ln$_x$CuO$_{3-y}$ Cpd. System", Jap. J. Appl. Phys., vol. 26, No. 5 (May 1987), pp. L815–L817.
"High Temp S/C in Rare Earth (R)-Ba$_2$Cu$_3$O$_{9-\delta}$", Yang et al., Solid State Comm., vol. 63, No. 6, pp. 515–519 (Aug. 1987).
Zhao et al., "Effect of Sc on the S/C of Ba-Y-Cu Oxides", Solid State Comm., vol. 63, No. 6, pp. 409–410 (Aug. 1987).
Moreland et al., "Josephson Effect Above 77° K. in a YBaCuO Break Junction", Appl. Phys. Lett., vol. 51, No. 7, pp. 540–541 (Aug. 1987).
Worthington et al., "Anisotropic Nature of High Tc S/C in Single Crystal Y$_1$Ba$_2$Cu$_3$O$_{7-x}$", Phys. Rev. Lett., vol. 59, No. 10, pp. 1160–1163 (Jul. 9, 1987).
Camps et al., "Microstructure and Critical Current of S/C YBa$_2$Cu$_3$O$_{7-x}$", Lett. to Nature, vol. 329 (17), (Sep. 1987), pp. 229–232.
Inam et al., "As-Deposited High T$_c$ and J$_c$ S/C Thin Films Made at Low Temperatures", Appl. Phys. Lett., vol. 53, No. 10 (May 9, 1988), pp. 908–910.
Takada et al., "Tunnel Junctions Using Oxide S/C Thin Films Epitaxially Grown on SrTiO$_3$", Appl. Phys. Lett., vol. 53, No. 26 (Dec. 26, 1988), pp. 2689–2691.
Yoshiara et al., "Superconductivity of Screen-Printed YBa$_2$Cu$_3$O$_y$ Thick Films on Y$_2$BaCuO$_5$ Substrates", Jap. J. Appl. Phys., vol. 27, No. 8, Aug. 1988.
Poppe et al., "Epitaxial Multilayers of YBa$_2$Cu$_3$O$_7$ and PrBa$_2$Cu$_3$O$_7$ as a Possible Basis for Superconducting Electronic Devices", Solid State Comm., vol. 71, No. 7, 1989, pp. 569–572.

Primary Examiner—Andrew J. James
Assistant Examiner—Daniel N. Russell
Attorney, Agent, or Firm—Oblon, Spivak, McClelland, Maier & Neustadt

[57] ABSTRACT

A device made with thin layers comprises at least two layers of materials having different electrical characteristics. At least one of the layers is superconductive. The superconductive layer comprises a rare earth (or yttrium) which is chosen so as to confer superconductive characteristics. The other layer has a constitution which differs from that of the superconductive layer, solely by the fact that the rare earth is different and confers different electrical properties.

8 Claims, 2 Drawing Sheets

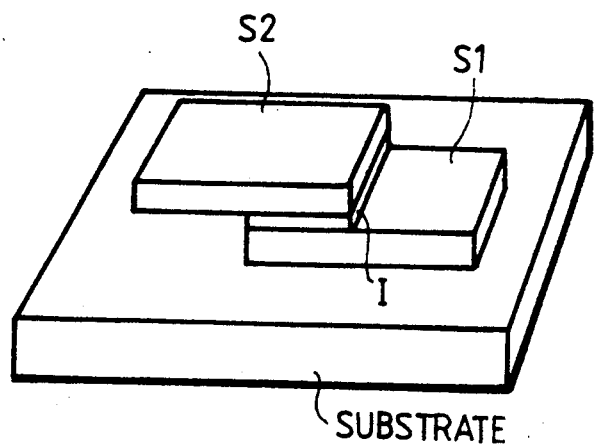
FIG_1
PRIOR ART
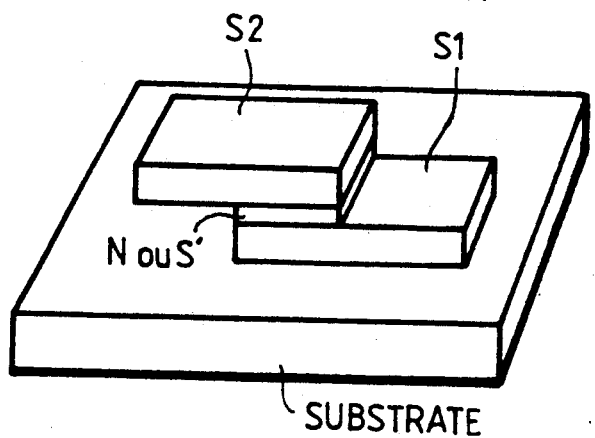
FIG_2
PRIOR ART

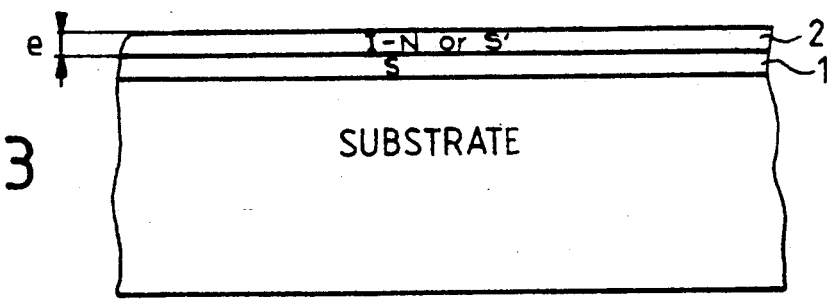
FIG_3
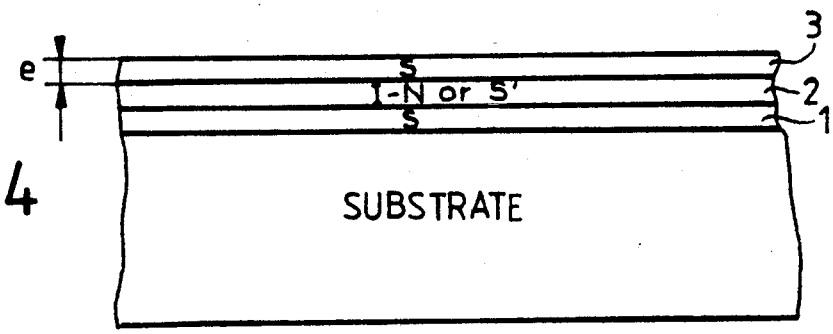
FIG_4
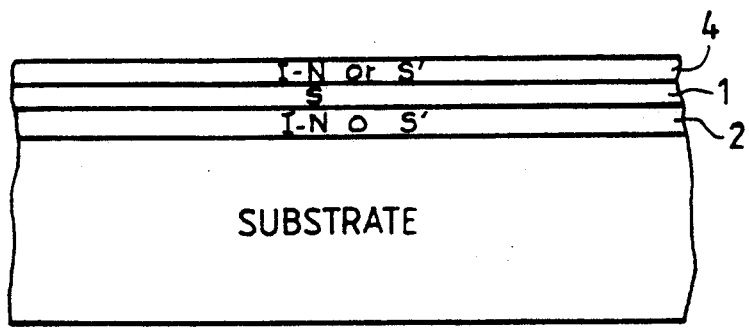
FIG_5
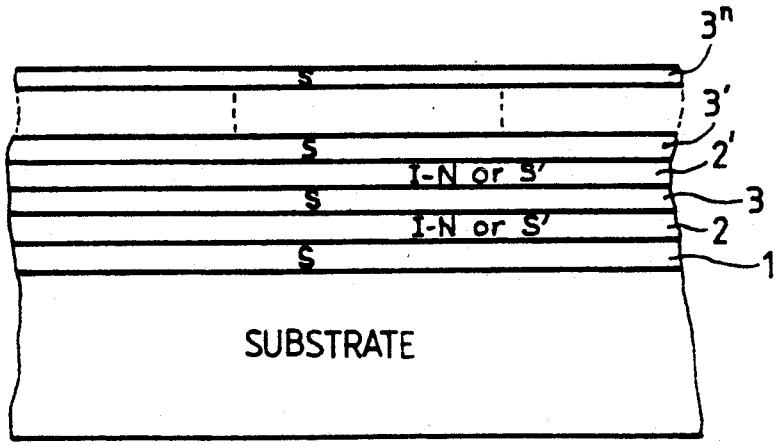
FIG_6

JOSEPHSON JUNCTIONS MADE WITH THIN SUPERCONDUCTIVE LAYERS

This application is a continuation of application Ser. No. 305,020, filed on Feb. 2, 1989, now abandoned.

BACKGROUND OF THE INVENTION

1. Field of the Invention

The invention concerns a device made with thin layers of superconducting material and a method for its fabrication and, more particularly, a device with thin layers comprising at least one superconductive thin layer.

2. Description of the Prior Art

Josephson junctions are the basic constituent elements of numerous superconducting devices including SQUIDS (superconducting quantum interference devices), mixers, correlators, superconductive memories, etc).

The discovery of superconductivity at high superconducting transition temperatures (superconducting transition temperature hereinafter denoted Tc), in $La_{2-x}Sr_xCuO_4$ type oxides (which have Tc close to the 30° K.), and then in $YBa_2Cu_3O_{7-y}$ (which have Tc close to 90° K.), has made it possible to envisage the making of Josephson junctions which have working temperatures in the region of the temperature of liquid nitrogen (77° K.).

Various Josephson junctions technologies made with low Tc materials (materials such as Nb, Sn, Pb), have been previously studied (for example, point contact junctions, bridge junctions, micro-bridge junctions or junctions with variation in thickness). This invention concerns adaptation of the new "high Tc" materials, for junction technologies where there is a very thin layer of insulating, conductive or slightly superconductive material between the two electrodes. More precisely these junction technologies are superconductor-insulant-superconductor (SIS) tunnel effect junctions and sandwich junctions with proximity effect of the superconductor-normal metal-superconductor (SNS) type or the superconductor-lower Tc superconductor-superconductor (SS'S) type. FIGS. 1 and 2 give a schematic view of these different types of junctions.

FIG. 1 shows a tunnel effect junction with layers of superconductive materials S, S1 and S2 separated by an insulating layer I. The entire structure is supported on a substrate.

FIG. 2 shows a sandwich junction designed for proximity effect conduction, which has 2 layers of superconductive material, S1 and S2, separated by a normal metal layer N, or a lower Tc or a lower critical current (Jc) layer S'. A lower Tc and/or lower Jc makes the S' layers less superconductive than the materials of the layers S1 and S2. The structure is supported on a substrate.

The main constraint related to the use of these technologies with new materials lies in the fact that, to obtain the expected operation of the Josephson structure thus formed, it is absolutely necessary that the barrier between the two superconductive electrodes should have a thickness of the magnitude of the coherence length of the superconductive material used. This characteristic length was fairly high (280 angstroms for niobium, 2300 angstroms for tin, 830 angstroms for lead, etc.) in low Tc superconductors. In high to superconductors the coherence length is shorter. For instance, it is only 34 angstroms along the least favorable axis, namely c, in $YBa_2Cu_3O_{7-y}$ (and 7 angstroms along the axes a and b,), as determined recently by T. K. Worthington et al in "Physical Review Letters" 59 (10), 1160 (1987).

The superconductive character of the new oxide materials is intimately related to the structure, as has been demonstrated by several authors, especially R. J. Cava et al in Physical Review Letters 58 (16), 1676 (1987). It is therefore not only necessary to be able to make a layer with a thickness of about 20 angstroms in order to separate the two superconductive electrodes but also to have the ability, to obtain a material having the right crystal structure on either side of this barrier, to within a distance of about one elementary lattice constant.

SUMMARY OF THE INVENTION

An object of the invention is a structure based on superconductive materials that resolves the problem of making a layer with a thickness of about 20 angstroms which maintains the crystal structure of the superconductor on both sides of the layer, as well as the method for making this structure.

The invention therefore concerns a device of superconductive material comprising at least two layers, attached to each other, of materials with different electrical characteristics, wherein:

a first layer of superconductive material has a determined constitution and has at least one rare earth element (or yttrium) chosen so that the material is superconductive at a high critical temperature;

a second layer made of a material with a constitution differing from that of the material of the first layer solely in that the rare earth element is different and is chosen so that the material has electrical characteristics which are different from those of the first layer (insulating, metallic, or a weak superconductor).

The invention is directed to a method for making a device with thin layers of superconductive material. This method comprises at least one step of epitaxy of a layer of a superconductive material. One of the constituent elements used in the epitaxy is a rare earth constituent of the superconductive material. During the epitaxy step, there is provided at least one stage during which the rare earth is replaced by a different constituent element. This gives the layer obtained during this stage different electrical characteristics. The duration of this stage of thin film growth is such that the layer obtained has a thickness of a few atomic layers.

BRIEF DESCRIPTION OF THE DRAWINGS

The different objects and characteristics of the invention will appear more clearly from the following description, made by way of example, with reference to the appended figures.

FIGS. 1 and 2 show embodiments of prior art devices already described above.

FIGS. 3 to 5 show different embodiments of a device with thin layers of superconductive materials according to the invention.

FIG. 6 shows a multiple layer embodiment according to the invention.

DETAILED DESCRIPTION OF THE INVENTION

For a material of the type $TRBa_2Cu_3O_{7-y}$, where TR designates an element chosen from yttrium Y or a rare earth type of element, we consider substitutions of elements at the TR and Ba lattice sites.

The compounds in which TR comprises at least one of Y, Yb, Tm, Er, Ho, Dy, Gd, Eu or Sm are superconductive with very similar characteristics. For example, all these compounds have Tc near 93° K. and have a perovskite structure as described in the above-cited document by R. J. Cava et al.

On the contrary, when TR is at least one of La and Pr the structure is the same, but superconductivity is no longer observed. This has been reported by K. N. Yang et al in Solid State Com. 63 (6), 515 (1987). Besides, B. R. Zhao et al have reported, in an article in Solid State Com. 63 (5), 409 (1987), that the addition of scandium in very small quantities (>35%) destroys superconductivity in the system $YBa_2Cu_3O_{7-y}$. The scandium substitutes at the site of the yttrium. The possibility of making a substitution in this way is subordinated to preservation of the structure. Excessive substitution of Sc for TR changes the crystal structure.

The invention, therefore, consists in making a structure such as the one shown in FIG. 3 wherein a layer 1 of superconductive material is coated with a layer 2 of material having different electrical characteristics such as a lower Tc or critical current density, or a lack of superconducting properties with metallic behavior, or insulating characteristics. The two layers are different due to the substitution of one rare earth element, for another rare element in such a way that the two materials have the same structure. For example, since the layer 1 of superconductive material is of the type $TR Ba_2 Cu_3 O_{7-y}$, with TR chosen in such a way that the material is superconductive with a high Tc, the layer 2 is made by substituting the rare earth TR with lanthanum or praseodymium or by substituting a small quantity of Sc for an equal quantity of TR. We thus have a layer 2 of a material which has metallic properties, known in the prior art as a "normal metal" designated by the letter N in FIG. 3.

Other lattice sites substitution can be made with other short coherence length oxide superconductors in which substitutions are known which inhibit the superconducting behavior of the compound. We then obtain, depending on the substitution:
either an insulating layer 2 (1 in FIG. 3)
or a layer 2 which is less superconducting than layer 1 (S' in the FIG. 3).

The layers 1 and 2 are thin layers and, notably, the layer 2 has a thickness, e, of a few atomic layers.

FIG. 4 represents a structure according to which two layers 1 and 3 of superconductive material enclose a layer 2 of a material with different electrical characteristics than layers 1 and 3. Layer 2 in FIG. 4 has identical constitution to layer 2 in FIG. 3. Layer 2 is then either insulating (I), or a normal metal (N), or a weak superconductor (S').

FIG. 5 shows a structure in which layer 1 of superconductive material is enclosed by layers 2 and 4 of material which is electrically different from layer 1. The layers 2 and 4 are similar to the layer 2 of the structure of FIG. 3. Layers 2 and 4 may be insulating (I), normal metal (N), or weakly superconductive (S'). Layers 2 and 4 may be different. For example, the layer 2 may be insulating (I) and the layer 4 may be weakly superconductive (S'), or vice versa.

FIG. 6 shows a structure comprising alternating superconducting layers (1, 3, 3', ... n) and layers (2, 2', ...) made of a material which is electrically different from the superconductive material. These layers (2, 2' ...) can thus each be either insulating or metallic or weakly superconducting.

The thin layers of superconducting oxides can be prepared by molecular beam expitaxial growth as described in the French patent No. 87 09462 by G. Creuzet and A. Freiderich, which relates a method for making thin layers of superconductive materials, and devices made by this method. French patent no. 87 09462 provides for making the layers described above by epitaxy on a substrate. French Patent No. 87 09462 teaches supplying different constituent atoms to the growing film at different rates, in order to adjust the lattice parameters of the film to the lattice parameters of the substrate. The epitaxial growth can also be done directly from a superconductive material.

The structures described above in relation to FIGS. 3 to 6 may be made by momentary interruption of the molecular beam epitaxial growth of the superconductive layers in order to make the I, N or S' layer. For example, with the following general formula

$TR\ Ba_2Cu_3O_{7-y}$ with TR chosen so that $TR\ Ba_2Cu_3O_7$ is superconducting the growth conditions are modified as follows: To produce the thin I, N, or S' layer when TR is substituted by La or Pr, the TR cell will be closed for a time corresponding to a few atomic layers of film growth and the La or Pr cell will be opened in a synchronized way during this time. At the end of this stage, the reverse operation will be performed to resume the growth of the superconductor in order to make the second electrode.

In the case of substitution by very small quantities of Sc, the Sc cell will be opened while simultaneously diminishing the power of the TR cell in order to achieve partial substitution in the desired proportions. The quantity of Sc is kept small in order to preserve the crystal structure.

The invention can be extended to any method enabling the destruction or reduction of the superconductive properties of a high Tc material of the $TR\ Ba_2Cu_3O_{7-y}$ type by chemical modification of one or more elements under growth and on a few atomic layers.

In particular, the transportation of the elements Ba and Cu, (in the form of fluorinated compounds ($BaF_2$, and $CuF_2$) which leads to a total or partial occupation of the oxygen sites by fluorine without damage to the crystalline strucure, is included in the method.

Moreover, all the ultra high vacuum techniques enabling this type of substitution, such as planar doping, come within the scope of the invention. In this respect, planar doping would consist, for example, in the introduction of a monolayer of Pr or La on the surface of the superconductor layer S, and then in resuming the epitaxy of the superconductor on this monolayer.

The method of the invention extends to sandwich structures where several layers are epitaxially grown in order to achieve complex systems of junctions. The resulting structures are of the S-N-S-N-S- type as described in FIG. 6.

The method of the invention also extends to the possibility of making encapsulation layers which are impermeable to oxygen on top of the above described structures. The encapsulating layers are similar to those described in the above-described patent by G. CREUZET and A. FRIEDERICH, July 1987.

It is seen that the invention lies mainly in the fact that a barrier made of non-superconductive material is achieved by the substitution for one of the constituent elements of the superconductive material by another element, in some of the atomic layers of the structure. The barrier is made in such a way that the very thin layers thus made possess electrical properties of the insulating, normal metal or weak superconductive type.

An intermediate layer of a junction comprising a first superconductive electrode, is made by total substitution of TR by La or Pr or by substitution of a small quantity of Sc for TR. This operation is conducted on several atomic layers, and the growth of the superconductive material is then resumed under normal conditions in order to make a second superconductive electrode. This operation is conducted with a continuity of the crystalline structure on either side of the barrier. This total or partial substitution is of a planar type because it concerns only a few atomic layers.

In the three cases considered (total substitution of TR by La or Pr, or partial substitution by Sc), the intermediate compound is not superconductive but has metallic properties. The junction is therefore of the SNS type. However, the invention extends to any substitution, of the same nature, of another element which may lead to a SIS or SS'S type junction.

It is quite clear that the above description has been given purely by way of a non-restrictive example. Other variants can be contemplated without going beyond the scope of the invention. The digital values have been given purely to illustrate the description. The application of the invention to a superconductor based structure of the TR $Ba_2Cu_3O_{7-y}$ type has been give purely by way of example.

What is claimed is:

1. A thin film superconducting device comprising:
    a first layer of single crystal high Tc superconductor with a crystal structure and a plurality of nonequivalent lattice sites therein and with a first face and a second face;
    a second layer with a first and second face, said first face of said second layer attached to said second face of said first layer wherein, said second layer is isostructural and epitaxial with said first layer;
    wherein, a plurality of first equivalent lattice sites in said first layer are occupied by an element of a first group consisting of Y, Yb, Tm, Er, Ho, Dy, Gd, Eu, and Sm, wherein a plurality of second equivalent lattice sites in said second layer exist which are crystallographically identical to said first equivalent lattice sites, said second equivalent lattice sites are occupied by a second atom selected from a member of a second group consisting of a combination of Y and Sc, and a combination of a rare earth and Sc.

2. A thin film superconducting device, as recited in claim 1 further comprising:
    a third layer comprising said high Tc superconductor with said third layer having first and second faces, said first face of said third layer attached to said second face of said second layer; said third layer isostructural and epitaxial with said second layer.

3. A thin film superconductive device, as recited in claim 1, further comprising:
    a plurality of pairs of layers; said pairs having compositions identical to said first and second layers, and wherein all said layers are isostructural, and each of said layers is epitaxial with adjacent layers.

4. A thin film superconducting device, as recited in claim 2 wherein said crystal structure is the orthorhombic $YBa_2Cu_3O_{7-y}$ crystal structure wherein $y=0$ to $0.3$ and wherein said structure refers to all related structural variations having a selected oxygen content, with disorder in positions of said O oxygen atoms, that do not essentially effect Tc.

5. A thin film superconducting device, as recited in claim 3, wherein said crystal structure is the orthorhombic $YBa_2Cu_3O_{7-y}$ structure wherein $y=0$ to $0.3$ and wherein said structure refers to all related structural variations having a selected oxygen content, with disorder in positions of said oxygen atoms, that do not essentially effect Tc.

6. A thin film superconducting device, as recited in claim 4, wherein said second equivalent lattice sites are occupied by atoms from a member of the group consisting of a combination of a rare earth and Sc, and a combination of Y and Sc.

7. A thin film superconducting device, as recited in claim 5, wherein said second equivalent lattice sites are occupied by atoms from a member of the group consisting of a combination of a rare earth and Sc, and a combination of Y and Sc.

8. A thin film superconducting device, as recited in any one of claims 1, 2, 3, 4, 5, 6, or 7, wherein said lower Tc layer is no more than 3 times as thick as the larger of the group of the coherence length in said first layer, and the coherence length in the second layer.

* * * * *